(12) United States Patent
Kim et al.

(10) Patent No.: US 11,382,244 B2
(45) Date of Patent: Jul. 5, 2022

(54) ANTI-RADIATION STRUCTURE, TEMPERATURE-PRESSURE COMPLEX SENSOR INCLUDING THE SAME AND HAVING ANTI-RADIATION PROPERTY, AND MANUFACTURING METHOD THEREOF

(71) Applicant: Electronics and Telecommunications Research Institute, Daejeon (KR)

(72) Inventors: Seong Jun Kim, Daejeon (KR); Choon Gi Choi, Daejeon (KR); Tam Van Nguyen, Daejeon (KR); Bok Ki Min, Daejeon (KR); Shuvra Mondal, Seoul (KR); Yoonsik Yi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 297 days.

(21) Appl. No.: 16/566,221

(22) Filed: Sep. 10, 2019

(65) Prior Publication Data

US 2020/0170149 A1 May 28, 2020

(30) Foreign Application Priority Data

Oct. 26, 2018 (KR) .................. 10-2018-0128659
May 29, 2019 (KR) .................. 10-2019-0063064

(51) Int. Cl.
*H05K 9/00* (2006.01)
*G01L 1/22* (2006.01)
(Continued)

(52) U.S. Cl.
CPC .............. *H05K 9/0073* (2013.01); *G01K 7/22* (2013.01); *G01L 1/2268* (2013.01); *B82Y 15/00* (2013.01); *B82Y 30/00* (2013.01)

(58) Field of Classification Search
CPC ...... H05K 9/0073; G01K 7/22; G01L 1/2268; B82Y 15/00; B82Y 30/00
(Continued)

(56) References Cited

U.S. PATENT DOCUMENTS

2013/0104986 A1 5/2013 Jung et al.
2014/0346408 A1 11/2014 Yun et al.
(Continued)

FOREIGN PATENT DOCUMENTS

KR 101887281 B1 8/2018
KR 101897130 B1 9/2018
(Continued)

OTHER PUBLICATIONS

Yang Yue, et al., "3D hybrid porous Mxene-sponge network and its application in piezoresistive sensor", Nano Energy, vol. 50, pp. 79-87, 2018.
(Continued)

*Primary Examiner* — Nathaniel T Woodward
(74) *Attorney, Agent, or Firm* — Rabin & Berdo, P.C.

(57) ABSTRACT

Provided is a temperature-pressure complex sensor with an anti-radiation property including a first sensing material which is a porous conductive film, and second sensing materials which are dispersedly disposed on a surface of the first sensing material. The second sensing materials may include a conductive structure having a two-dimensional crystal structure, and nanoparticles having a radiation shielding property which are disposed between crystal layers of the conductive structure.

8 Claims, 9 Drawing Sheets

(51) Int. Cl.
  *G01K 7/22* (2006.01)
  *B82Y 15/00* (2011.01)
  *B82Y 30/00* (2011.01)
(58) Field of Classification Search
  USPC .......................................................... 73/426
  See application file for complete search history.

(56) References Cited

U.S. PATENT DOCUMENTS

2019/0011288 A1* 1/2019 Nassar ............... A61B 5/02141
2020/0232970 A1* 7/2020 Haick .................. G01N 33/497

FOREIGN PATENT DOCUMENTS

KR    20190122525 A    10/2019
KR      102075911 B1     2/2020

OTHER PUBLICATIONS

Yu Pang, et al., "Flexible, Highly Sensitive, and Wearable Pressure and Strain Sensors with Graphene Porous Network Structure", ACS Appl. Mater. Interfaces, vol. 8, pp. 26458-26462, 2016.

* cited by examiner

ANTI-RADIATION STRUCTURE, TEMPERATURE-PRESSURE COMPLEX SENSOR INCLUDING THE SAME AND HAVING ANTI-RADIATION PROPERTY, AND MANUFACTURING METHOD THEREOF

CROSS-REFERENCE TO RELATED APPLICATIONS

This U.S. non-provisional patent application claims priority under 35 U.S.C. § 119 of Korean Patent Application Nos. 10-2018-0128659, filed on Oct. 26, 2018, and 10-2019-0063064, filed on May 29, 2019, the entire contents of which are hereby incorporated by reference.

BACKGROUND

The present disclosure herein relates to an anti-radiation structure, a temperature-pressure complex sensor with an anti-radiation property, and a method for manufacturing the same.

With the increasing world population and the industrialization of the developing countries, demanding of energy is increased, and thus the importance of nuclear power generation is also increased. However, the nuclear power generation is a limitless energy source, but a radiation leakage may cause a lot of damage when an accident happens due to the lack of safety management. Thus, it is very important to prevent accidents that may occur in a nuclear reactor by monitoring, in real time, the inside of the nuclear reactor or the temperatures of cooling water lines in a nuclear reactor line. A temperature sensor currently being used in a nuclear reactor is a thermocouple or a thermistor, which is highly vulnerable to radiation exposure. Thus, temperature sensor technology having an anti-radiation property is demanded.

A thermistor is a semiconductor resistor which is sensitive to heat, and which is an electronic component using the characteristics in which the resistance of a substance varies with temperature. The thermistor is also referred to as a thermal variable resistor, and is mainly used as a sensor which is to prevent the electricity of a circuit from being increased to a certain level or to detect the temperature of a circuit. Such a thermistor is classified into a positive temperature coefficient thermistor in which resistance increases as temperature rises, and a negative temperature coefficient thermistor in which resistance decreases as temperature rises.

Upon receiving tension or compression, an object changes in length. A pressure sensor is a sensor using the feature in which the change in length of an object causes the electrical resistance of the object to be changed accordingly. A piezoresistive sensor is a pressure sensor using a piezoresistive effect in which when force is applied to the outside, the length gets longer to cause a cross-sectional area to be reduced thereby resulting in an increase in resistance, and vice versa. According to the structure, a rubber-type pressure sensor is classified into a positive piezoresistive pressure sensor in which a resistance increases in proportion to an increment/decrement in length when a pressure is applied to the outside to increase the length, and a negative piezoresistive pressure sensor in which a resistance decreases according to an increment/decrement in length when a pressure is applied.

SUMMARY

The present disclosure provides an anti-radiation structure with an anti-radiation property, a temperature-pressure complex sensor with an anti-radiation property, and a method for manufacturing the same.

The present disclosure also provides a temperature-pressure complex sensor with improved sensing sensitivity, and a method for manufacturing the same.

The present disclosure also provides an anti-radiation structure with elasticity, a temperature-pressure complex sensor, and a method for manufacturing the same.

Objectives of the present disclosure are not limited to those described above and other objectives unmentioned will be clearly understood by those skilled in the art from the following description.

A temperature-pressure complex sensor with an anti-radiation property, according to embodiments of the inventive concept, which is for addressing aforementioned technical issues, may include a first sensing material which is a porous conductive film, and second sensing materials which are dispersedly disposed on a surface of the first sensing material. The second sensing materials may include a conductive structure having a two-dimensional crystal structure, and nanoparticles disposed between crystal layers of the conductive structure.

According to an embodiment, the first sensing material may have a conductive material having a two-dimensional crystal structure. The first sensing material may have holes vertically passing through the surface of the first sensing material.

According to an embodiment, the first sensing material may include a multilayer graphene.

According to an embodiment, the porosity of the first sensing material may be 50% to 98%.

According to an embodiment, the conductive structure and the nanoparticles may include an anti-radiation material.

According to an embodiment, the conductive structure may include transition metal carbides.

According to an embodiment, the nanoparticles may include metal oxides.

According to an embodiment, the temperature-pressure complex sensor with an anti-radiation property may include a protective layer which covers the first sensing material and the second sensing materials.

A method for manufacturing a temperature-pressure complex sensor with an anti-radiation property, according to embodiments of the inventive concept, which is for addressing aforementioned technical issues, may include forming a first sensing material of a surface of a porous sacrificial layer, forming second sensing materials by inserting nanoparticles between crystal layers a conductive structure having a two-dimensional crystal structure, attaching the second sensing materials onto a surface of the first sensing material, and removing the porous sacrificial layer.

According to an embodiment, the porous sacrificial layer may have holes which pass through the porous sacrificial layer in a direction perpendicular to a top surface of the first sensing material.

According to an embodiment, the porosity of the porous sacrificial layer may be 50% to 98%.

According to an embodiment, the forming of the second sensing materials may include forming a precursor solution including the conductive structure, adding the nanoparticles having a radiation shielding property to the precursor solution, and performing an ultrasonication process on the precursor solution. The nanoparticles may be inserted between the crystal layers of the conductive structure by the ultrasonication process.

According to an embodiment, the first sensing material may have a conductive material having a two-dimensional crystal structure.

According to an embodiment, the method may further include before removing the porous sacrificial layer, forming a protective layer by applying a polymer material to cover the first sensing material.

According to an embodiment, the removing of the porous sacrificial layer may be performed through a wet etching process.

An anti-radiation structure according to embodiments of the inventive concept, which is for addressing aforementioned technical issues, may include a porous conductive film, a plurality of clusters dispersedly disposed on a surface of the porous conductive film, and a protective layer which covers the porous conductive film and the plurality of clusters. The plurality of clusters may include a conductive structure having a two-dimensional crystal structure, and nanoparticles disposed between crystal layers of the conductive structure.

According to an embodiment, the porous conductive film may include a conductive material having a two-dimensional crystal structure. The porous conductive film may have holes vertically passing through the surface of the porous conductive film.

According to an embodiment, the porosity of the porous conductive film may be 50% to 98%.

According to an embodiment, the conductive structure may include transition metal carbides.

According to an embodiment, the nanoparticles may include metal oxides having a gamma ray shielding property.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The preferable embodiments of the present disclosure will now be described with reference to the accompanying drawings for sufficiently understanding configurations and effects of the inventive concept. However, the inventive concept is not limited to the following embodiments and may be embodied in different ways, and various modifications may be made thereto. The embodiments are just given to provide complete disclosure of the inventive concept and to provide thorough understanding of the inventive concept to one of ordinary skill in the art. It will be understood by one of ordinary skill in the art that the inventive concept may be performed in a certain suitable environment.

The terminology used herein is for the purpose of describing particular embodiments only and is not intended to limit the scope of the present disclosure. As used herein, the singular forms are intended to include the plural forms as well, unless the context clearly indicates otherwise. It will be understood that terms "comprises/includes" and/or "comprising/including" when used in this specification, specify the presence of stated components, steps, operations and/or elements, but do not preclude the presence or addition of one or more other components, steps, operations and/or elements.

When a film (or layer) is referred to as being on another film (or layer) or substrate, it may be directly formed on another film (or layer) or substrate, or a third film (or layer) may also be interposed therebetween.

Although the terms first, second, third, etc. have been used in various embodiments herein to describe various regions, and films (or layers) and the like, it should be understood that these regions and layers are not limited to the terms. These terms are merely used to distinguish predetermined region or film (or layer) from other region of film (or layer). Accordingly, the film referred to as a first film in any one embodiment may be referred to as a second film in other embodiments. Embodiments described and exemplified herein include complementary embodiments thereof. Like reference numerals refer to like components throughout the specification.

Unless otherwise defined, all terms used herein have the same meaning as commonly understood by one of ordinary skill in the art to which this invention pertains.

Figure 1:
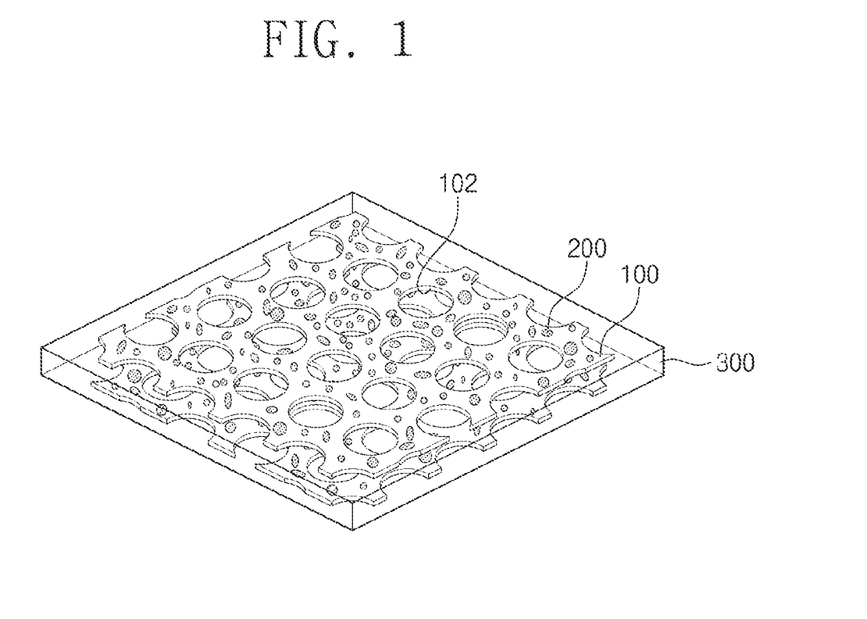
FIG. 1 is a cross-sectional view for describing a temperature-pressure complex sensor with an anti-radiation property according to embodiments of the inventive concept.
Figure 2:
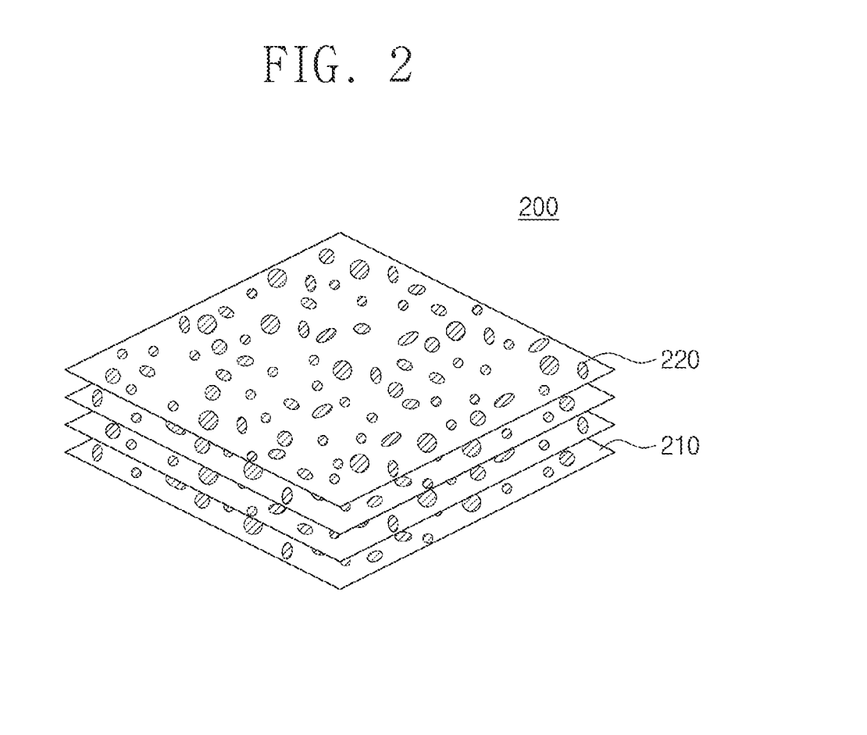
FIG. 2 is a schematic view for describing a second sensing material.

Hereinafter, an anti-radiation structure according to a concept of the inventive concept will be described with reference to the drawings. The present embodiment will be described that an anti-radiation structure employs a temperature-pressure complex sensor with an anti-radiation property which is capable of detecting a temperature and pressure, as an exemplary example. FIG. 1 is a cross-sectional view for describing a temperature-pressure complex sensor with an anti-radiation property according to embodiments of the inventive concept. FIG. 2 is a schematic view for describing a second sensing material.

Referring to FIG. 1, a first sensing material 100 may be provided. The first sensing material 100 may include a porous conductive layer. The first sensing material 100 may have a mono-layer or multi-layer plate shape. The first sensing material 100 may have a porous shape. For example, each layer of the first sensing material 100 may have holes 102 passing through the first sensing material 100 in a direction perpendicular to the top surface of each layer. The porosity of the first sensing material 100 may be 50% to 98%. As the first sensing material 100 has a porous shape, the flexibility of the first sensing material 100 may be improved. For example, the tensile modulus of the first sensing material 100 may be 0% to 40%. The first sensing material 100 may have an anti-radiation material. The first sensing material 100 may have a conductive material having a two-dimensional crystal structure. Here, the two-dimensional crystal structure means a crystal structure in which bonds between constituent atoms are formed only on a two-dimensional plane, and a week Van der Waals bond is formed between crystal layers formed by the constituent atoms to have a layered structure. For example, the first sensing material 100 may include a graphene, a silicene, a molybdenum disulfide ($MoS_2$), a tungsten sulfide ($WS_2$), or a transition metal chalcogenide. The first sensing material 100 may be amorphous. Accordingly, a portion of the first sensing material 100 may have a large space between crystals in the crystal structure, other portion may have a smaller space between crystals in the crystal structure. Alternatively, the crystal layer of the first sensing material 100 is parallel to the surface of the first sensing material 100. In other words, the first sensing material 100 may have a structure in which crystal layers thereof are laminated in a direction perpendicular to the surface of the first sensing material 100. In this case, the holes 102 may vertically pass through the crystal layers of the first sensing material 100. The first sensing material 100 may be formed in the shape of a mono-molecular layer having one crystal layer or the shape of a multi-molecular layer having a plurality of crystal layers. The electrical properties of the first sensing material 100 may change according to a change in outside temperature. For example, the electrical resistance of the first sensing material 100 may change according to the temperature thereof. Specifically, when the temperature of the first sensing material 100 increases, the electrical resistance may increase. Accordingly, the first sensing material 100 may detect the outside temperature. Furthermore, the electrical properties of the first sensing material 100 may change according to the external pressure. For example, the first sensing material 100 may decrease in distance between crystal layers by the external pressure, and thus the electrical conductivity may change. Furthermore, when the first sensing material 100 includes an amorphous two-dimensional material, the spaces between crystals may be large, and sensitivity to the external pressure may be high. Accordingly, the first sensing material 100 may detect the external pressure, that is, a compressive force.

According to another embodiment, when an anti-radiation structure is not a temperature-pressure complex sensor, the first sensing material 100 may not be limited to materials for detecting a change in temperature or pressure. A porous conductive film of an anti-radiation structure (that is, corresponding to a first sensing material 100 of a temperature-pressure complex sensor) may include various materials having a two-dimensional crystal structure other than those listed in describing the first sensing material 100. Hereinafter, description will be given on the basis that an anti-radiation structure is a temperature-pressure complex sensor.

The second sensing materials 200 may be disposed on the surface of the first sensing material 100. The second sensing materials 200 may be provided in a particulate or cluster form. Here, the cluster means an aggregate in which a plurality (for example, several to hundreds) of atoms or molecules are aggregated. The second sensing materials 200 may be locally formed on the surface of the first sensing material 100. The second sensing materials 200 may have conductive structures and nanoparticles. FIG. 2 is a view for conceptionally illustrating crystal layers of a conductive structure, and illustrates the crystal layers of a conductive structure as a planar shape, for the convenience of understanding. Hereinafter, the configuration of a second sensing material will be described in detail with reference to FIG. 2.

Referring to FIG. 2, the conductive structure 210 may have a two-dimensional crystal structure. The conductive structure 210 may be formed in the shape of a multi-molecular layer having a plurality of crystal layers. The conductive structure 210 may include an anti-radiation material. The conductive structure 210 may include a conductive material. For example, the conductive structure 210 may include transition metal carbides (MXenes). The transition metal carbides may include titanium carbide ($Ti_3C_2$).

Nanoparticles 220 may be disposed in the conductive structure 210. Specifically, the nanoparticles 220 may be disposed between the crystal layers of the conductive structure 210. The nanoparticles 220 may include an anti-radiation material. In addition, the nanoparticles 220 may have a radiation shielding property. For example, the nanoparticles 220 may shield gamma rays. The nanoparticles 220 may have a diameter of 5 nm to 100 nm. The nanoparticles 220 may include an insulation material. For example, the nanoparticles 220 may include metal oxides. The metal oxides may include an iron oxide ($Fe_3O_4$).

The electrical resistance of the second sensing material 200 may change according to the external pressure. For example, the electrical conductivity of the second sensing material 200 may change with the external pressure, and the second sensing material 200 may detect the external pressure, that is, the compressive force. Specifically, when the external pressure is not applied to the second sensing material 200, the crystal layers of the conductive structure 210 may be spaced apart at a certain distance by the nanoparticles 220, and may have a high resistance due to an increase in contact resistance between the crystal layers of the conductive structure 210. However, when the external pressure is applied to the second sensing material 200, the distance between the crystal layers of the conductive structure 210 may be decreased, thereby decreasing the contact resistance between the crystal layers of the conductive structure 210. In other words, since the nanoparticles 220 are arranged in between the crystal layers of the conductive structure 210, the contact resistance between the crystal layers of the conductive structure 210 due to the external pressure may greatly change, thereby improving the pressure sensing sensitivity of the second sensing material 200.

A temperature-pressure complex sensor with an anti-radiation property according to embodiments of the inventive concept may detect a change in temperature using a first sensing material 100, and may detect a change in external pressure and compressive force using the first sensing material 100 and the second sensing material 200. Furthermore, the second sensing material 200 includes nanoparticles 220 between the crystal layers of the conductive structure 210 in which a contact resistance varies with pressure, thereby improving the compressive force sensing sensitivity of the temperature-pressure complex sensor with an anti-radiation property.

According to another embodiment, when an anti-radiation structure is not a temperature-pressure complex sensor, the second sensing material 200 may not be limited to materials for detecting a change in pressure. Clusters of an anti-radiation structure (that is, corresponding to a second sensing material 200 of a temperature-pressure complex sensor) may include various materials other than those listed in explaining the second sensing material 200. For example, a conductive structure 210 of an anti-radiation structure may include, other than those listed above, various materials having a two-dimensional crystal structure, such as a graphene or a molybdenum disulfide ($MoS_2$). The nanoparticles 220 of the anti-radiation structure may include an anti-radiation material. Hereinafter, description will be given on the basis that an anti-radiation structure is a temperature-pressure complex sensor.

Referring again to FIG. 1, a protective layer 300 may be provided on the first sensing material 100 and the second sensing material 200. The protective layer 300 may cover the first sensing material 100 and the second sensing material 200, and the first sensing material 100 and the second sensing material 200 may be embedded in the protective layer 300 and thus protected from the external shock. The protective layer 300 may be impregnated into holes 112 of the first sensing material 100 and vacant spaces (for example, vacant spaces in the crystal of the first sensing material 100, etc.) in the first sensing material 100. The protective layer 300 may include an anti-radiation material. The protective layer 300 may include an insulation material. The protective layer 300 may include a polymer material having flexibility. For example, the protective layer 300 may include polydimethylsiloxane (PDMS), Ecoflex, hydrogel, polyimide, polycarbonate, and flexible polymers, etc.

The first sensing material 100 and the second sensing material 200 of a temperature-pressure complex sensor with an anti-radiation property may be protected from the external shock by means of the protective layer 300. In addition, as the porous first sensing material 100 and the protective layer 300 covering the same have flexibility, a temperature-pressure complex sensor with a flexible anti-radiation property may be provided. Furthermore, since the first sensing material 100 and the second sensing material 200 include an anti-radiation material, and the first sensing material 100 and the second sensing material 200 are encompassed by the protective layer 300 having an anti-radiation property, the first sensing material 100 and the second sensing material 200 may not be damaged by high-radiation. In other words, the sensing property of the temperature-pressure complex sensor with the anti-radiation property according to embodiments of the inventive concept may not degrade in extreme environments (for example, nuclear power plants, etc.) such as high-radiation environments.

Furthermore, an anti-radiation structure of the inventive concept may have flexibility and include an anti-radiation material capable of shielding the radiation. Accordingly, the radiation may be easily shielded regardless of the shape of a radiation source or the shape of an object to be protected.

As the above, it has been exemplarily described that the anti-radiation structure of the inventive concept is a temperature-pressure complex sensor, but the inventive concept is not limited thereto.

Figure 3:
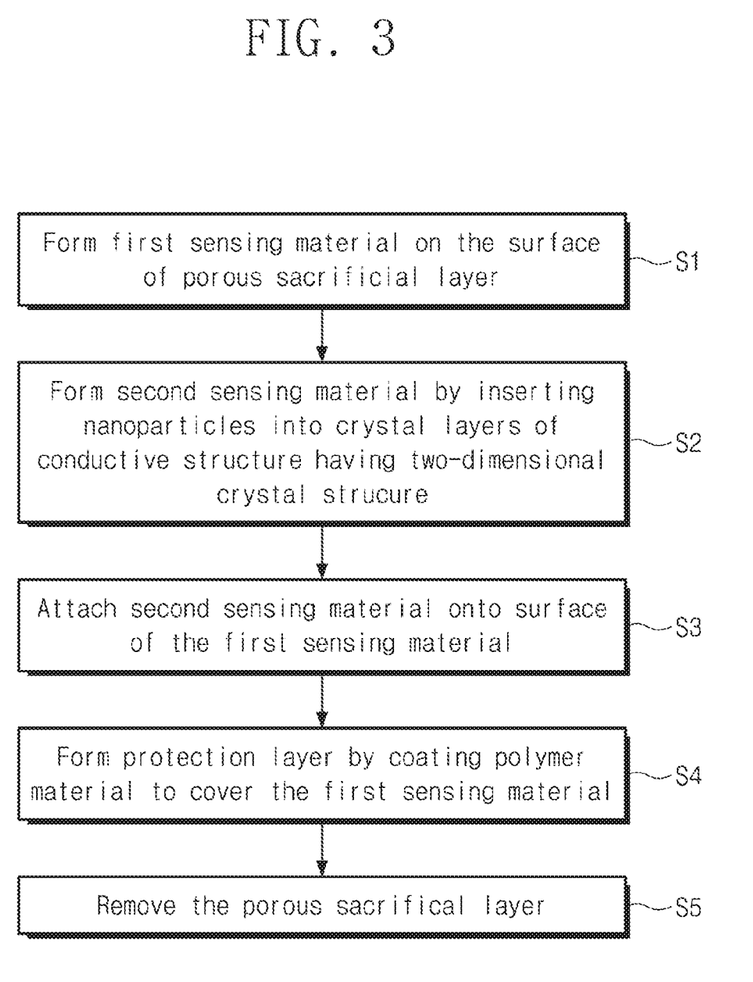
FIG. 3 is a flowchart for describing a method for manufacturing a temperature-pressure complex sensor with an anti-radiation property according to embodiments of the inventive concept.
Figure 4:
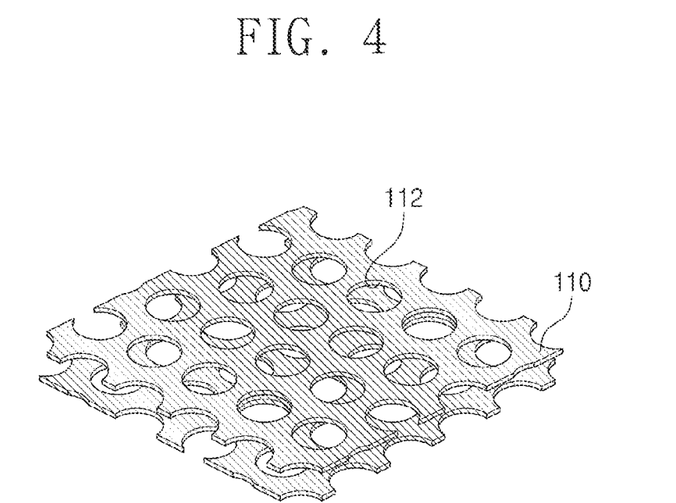
FIGS. 4 and 5 are perspective views for describing a method for forming a first sensing material.
Figure 5:
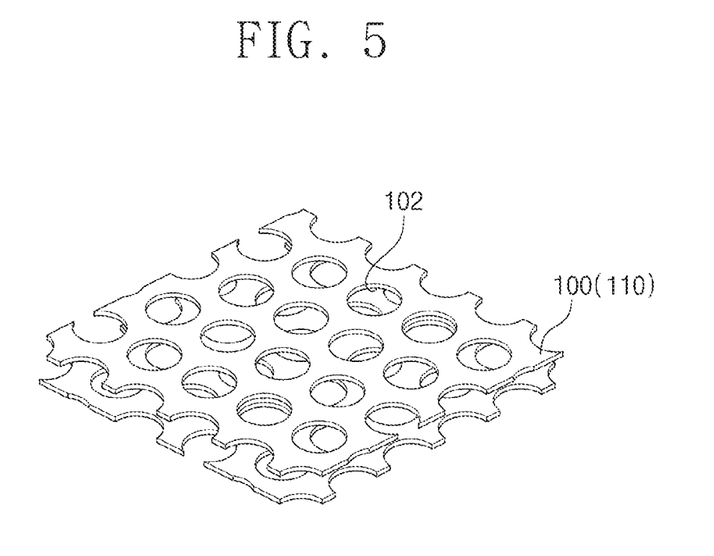
Figure 6:
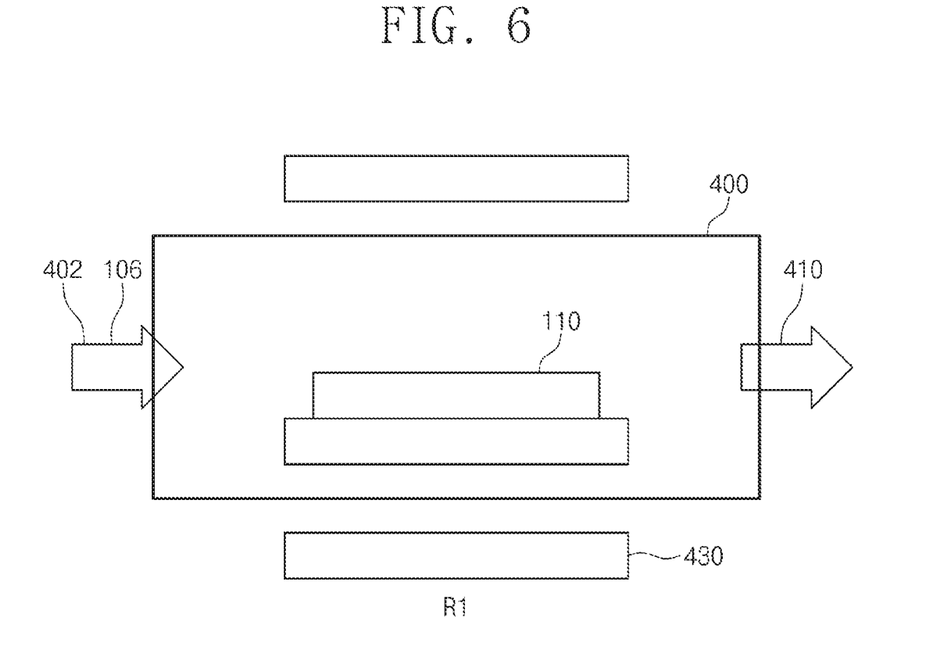
FIG. 6 is a view for describing a forming process of a first sensing material.
Figure 7:
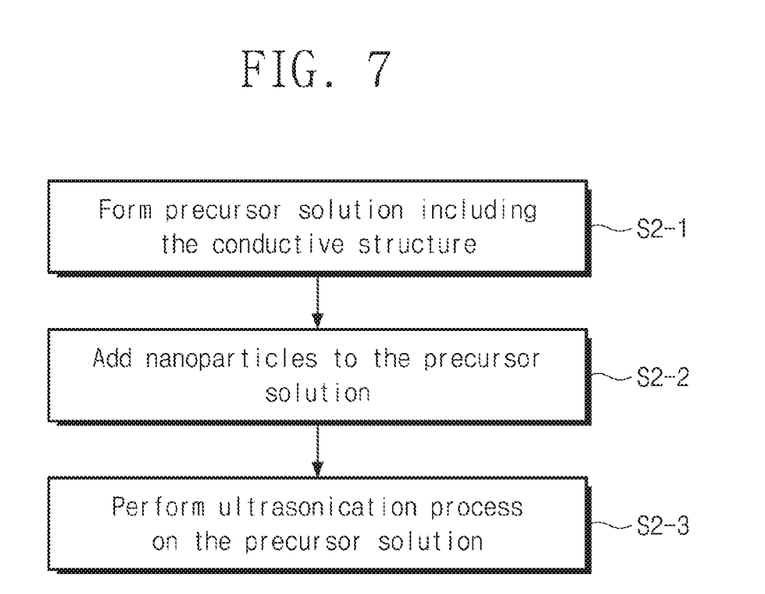
FIG. 7 is a flowchart for describing a method for forming second sensing materials.
Figure 8:
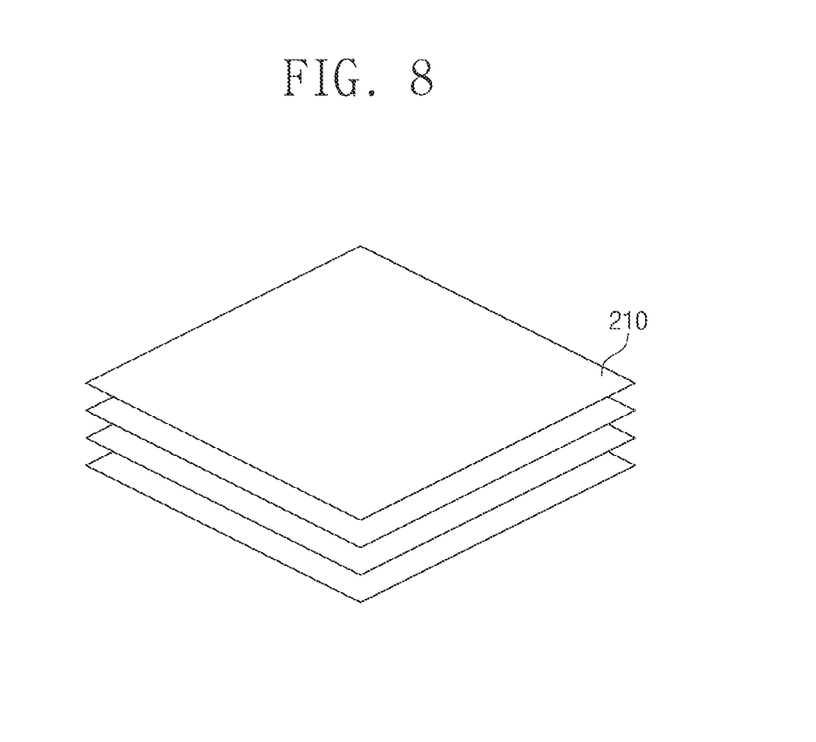
FIG. 8 is a perspective view for describing a method for forming a second sensing material.
Figure 9:
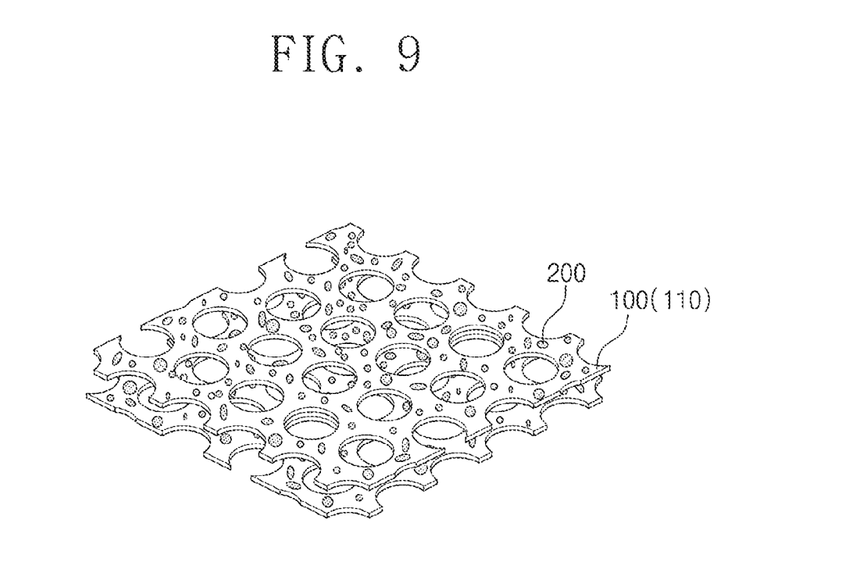
FIGS. 9 and 10 are perspective views for describing a method for manufacturing a temperature-pressure complex sensor with an anti-radiation property according to embodiments of the inventive concept.
Figure 10:
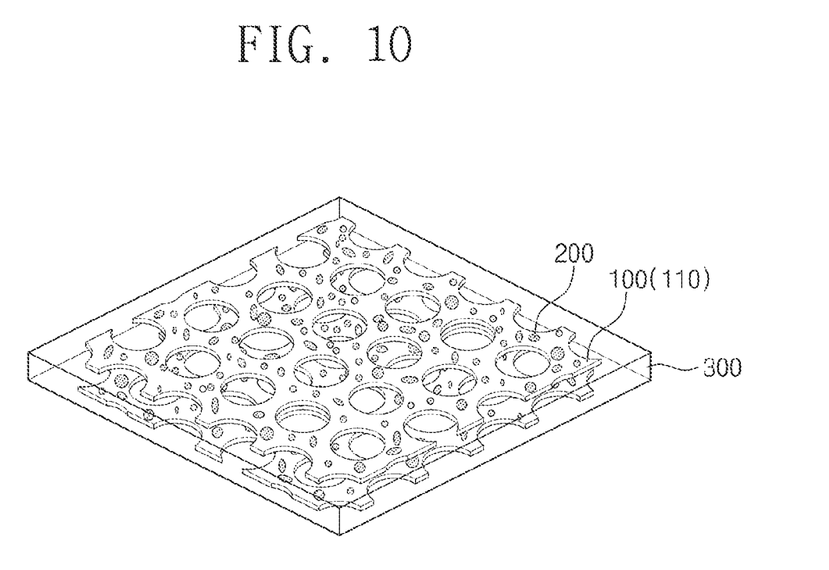

FIG. 3 is a flowchart for describing a method for manufacturing a temperature-pressure complex sensor with an anti-radiation property according to embodiments of the inventive concept. FIGS. 4 and 5 are perspective views for describing a method for forming a first sensing material. FIG. 6 is a schematic view for describing forming process of a first sensing material. FIG. 7 is a flowchart for describing a method for forming second sensing materials. FIG. 8 is a perspective view for describing a method for forming a second sensing material. FIGS. 9 and 10 are perspective views for describing a method for manufacturing a temperature-pressure complex sensor with an anti-radiation property according to embodiments of the inventive concept.

Referring to FIGS. 3 and 4, a sacrificial layer 110 may be provided. The sacrificial layer 110 may have a plate shape. The sacrificial layer 110 may be provided in a plurality of layers to overlap each other, or may be provided in a single layer. The sacrificial layer 110 may have a porous shape. For example, the sacrificial layer 110 may have holes 112 passing through the sacrificial layer 110 in a direction perpendicular to the top surface thereof. The porosity of the sacrificial layer 110 may be 50% to 98%. The sacrificial layer 110 may include a metal. For example, the metal may include nickel (Ni).

Referring to FIGS. 3 and 5, the first sensing material 100 may be formed on the surface of the porous sacrificial layer 110 (process S1). For example, the first sensing material 100 may be formed using a chemical vapor deposition (CVD) method. Hereinafter, an embodiment of the formation process S1 of the first sensing material 100 will be described in more detail.

Referring to FIG. 6, a chamber 400 may be provided. The inside of the chamber 400 may be provided in a vacuum state. For example, a vacuum pump 410 may be connected to one side of the chamber 400. The chamber 400 may have a first region R1. As to be described later, a chemical vapor deposition reaction may occur in the first region R1. A carrier gas 402 may be injected into the chamber 400. The carrier gas 402 may flow from one side of the chamber 400 through the first region R1 to the other side of the chamber 400. For example, the carrier gas 402 may include hydrogen ($H_2$) or argon (Ar). A heat generating part 430 may be provided outside the chamber 400. The heat generating part 430 may provide heat to the first region R1.

The sacrificial layer 110 may be provided in the chamber 400. The sacrificial layer 110 may be provided in the first region R1 of the chamber 400. A first sensing material source 106 may be provided in the chamber 400. The first sensing material source 106 may be provided in the first region R1 of the chamber 400. The first sensing material source 106 may be provided in a gas form, but an embodiment of the inventive concept is not limited thereto. The first sensing material source 106 may include carbon compounds such as methane ($CH_4$).

The first sensing material source 106 may be supplied on the sacrificial layer 110. The first sensing material source 106 may be diffused on the sacrificial layer 110 or moved on the sacrificial layer 110 by means of the carrier gas 402.

The first sensing material source 106 may be reacted on the surface of the sacrificial layer 110 to form the first sensing material 100 (see FIG. 5) on the surface of the sacrificial layer 110. For example, the first sensing material 100 is formed on the surface of the sacrificial layer 110 through gas phase reaction of the steam 106. In order to improve the reactivity of the steam 106, heat may be provided to the sacrificial layer 110 using the heat generating part 430. The first sensing material 100 may include a graphene. The first sensing material 100 may have a two-dimensional crystal structure. The first sensing material 100 may be formed to be amorphous. In addition, the crystal layers of the first sensing material 100 may uniformly cover the surface of the sacrificial layer 110. As shown in FIG. 5, the first sensing material 100 may be deposited to uniformly cover the surface of the sacrificial layer 110, and the appearance of the first sensing material 100 may be substantially same as the sacrificial layer 110. Depending on the shape of the sacrificial layer 110, the first sensing material 100 may be formed in a porous mono-layer or multi-layer plate shape. In other words, the first sensing material 100 may have holes 102 formed in the same position as the holes 112 of the sacrificial layer 110.

Still referring to FIG. 3, second sensing materials 200 may be formed by inserting nanoparticles 220 between the crystal layers of the conductive structure 210 (process S2). Hereinafter, referring to FIG. 7, an embodiment of the formation process S2 of the second sensing material 200 will be described in more detail.

Referring to FIG. 7, a precursor solution including a conductive structure 210 may be provided (process S2-1). Specifically, the precursor solution may be prepared by using deionized water (DI water) as a solvent and mixing the conductive structure material in the solvent. The conductive structure material may be added in a powder form to the solvent. FIG. 8 is a view for conceptionally illustrating crystal layers of a conductive structure, and illustrates the crystal layers of the conductive structure as being a planar shape, for the convenience of understanding. As shown in FIG. 8, the conductive structure 210 may have a two-dimensional crystal structure. The conductive structure 210 may be formed in a multi-molecular layer having a plurality of crystal layers. The conductive structure 210 may include titanium carbide ($Ti_3C_2$).

The nanoparticles may be mixed with the precursor solution (process S2-2). The nanoparticles may be added in a powder form to the precursor solution. The nanoparticles may have a diameter of 5 nm to 100 nm. The nanoparticles may include metal oxides ($Fe_2O_4$, and $Fe_3O_4$). Accordingly, the conductive structure 210 and the nanoparticles may be mixed in the deionized water solution.

An ultrasonication process may be performed on the precursor solution (process S2-3). The nanoparticles 220 may be inserted between the crystal layers of the conductive structure 210 through the ultrasonication process. As illustrated in FIG. 2 that describes a relationship between the conductive structure 210 and the nanoparticles 220, the nanoparticles 220 may be inserted between the crystal layers of the conductive structure 210 to form the second sensing material 200. The nanoparticles 220 may be dispersedly disposed between the crystal layers of the conductive structure 210. As aforementioned, a mixture solution in which the second sensing material 200 is mixed may be formed.

Referring to FIGS. 3 and 9, the second sensing materials 200 may be attached to the surface of the first sensing material 100 (process S3). For example, the mixture solution may be applied onto the sacrificial layer 110. Accordingly, the second sensing material 200 in the mixture solution may be attached to the surface of the first sensing material 100. The second sensing materials 200 may be locally attached onto the surface of the first sensing material 100. The solvent may then be removed. For example, the solvent may be vaporized.

Referring to FIGS. 3 and 10, the protective layer 300 may be formed applying a polymer material to cover the first sensing material 100 (process S4). For example, the polymer material may be applied onto the sacrificial layer 110. Accordingly, the polymer material may cover the first sensing material 100, and the second sensing material 200 which is on the surface of the first sensing material 100. The polymer material may embed the first sensing material 100 and the second sensing material 200. A post-process such as a heat treatment process or a drying process may be performed on the polymer material, if needed. The polymer material may include polydimethylsiloxane (PDMS), Ecoflex, hydrogel, polyimide, polycarbonate, and flexible polymers, etc.

The sacrificial layer 110 may then be removed (process S5). The sacrificial layer 110 may be removed using a wet etching process. For example, an etching solution may permeate the vacant spaces between the crystals of the first sensing material 100, and etch the sacrificial layer 110. A temperature-pressure complex sensor with an anti-radiation property may be formed through aforementioned processes.

Experimental Example 1

The same formation process as that for the temperature-pressure complex sensor with an anti-radiation property that has been described with reference to FIG. 1 was performed in this Experimental example 1 except that a first sensing material was formed using a graphene, a conductive structure of a second sensing material was formed using a titanium carbide ($Ti_3C_2$), and nanoparticles of the second sensing material were formed using an iron oxide ($Fe_3O_4$). A protective layer was then formed using a polydimethylsiloxane (PDMS).

Experimental Example 2

The same formation process was performed as that in Experimental example 1 except that a protective layer is not formed. In other words, a first sensing material was formed using a graphene, a conductive structure of a second sensing material was formed using a titanium carbide ($Ti_3C_2$), nanoparticles of the second sensing material were formed using an iron oxide ($Fe_3O_4$), and a protective layer was not coated so that the first sensing material and the second sensing material are exposed to the outside.

After the resultant products of Experimental example 1 and Experimental example 2 were subjected to irradiation, Raman analysis was performed before and after irradiation. Cobalt-60 as a radiation source was used for irradiation, and the radiation irradiation dose was approximately 1 kGy/hour. The total irradiation time of the radiation was 20 hours and 23 minutes, and the cumulative dose was 20.55 kGy.

Figure 11:
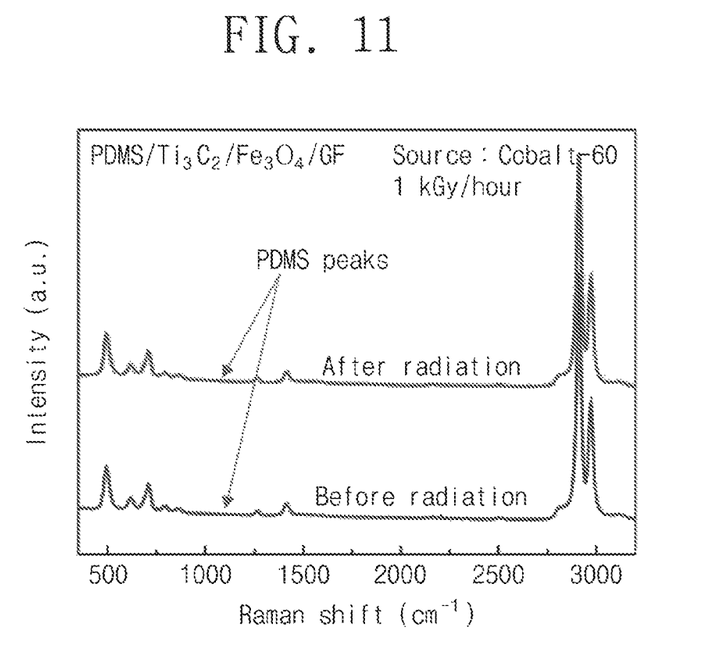
FIG. 11 is a graph showing a Raman analysis result of Experimental example according to irradiation.

FIG. 11 is a graph showing a Raman analysis result according to the irradiation in Experimental example 1. According to FIG. 11, it was observed that there was no change in the Raman spectrum in Experimental example 1, before and after irradiation. Furthermore, before and after irradiation, the peak of the protective layer (PDMS) was measured only. In other words, it was observed that there was no change in physical property of the protective layer in Experimental example 1 after irradiation. It was found that the protective layer of the temperature-pressure complex sensor with an anti-radiation property according to the inventive concept may not be changed in physical property after irradiation, and protects the first sensing material and the second sensing material against radiation.

Figure 12:
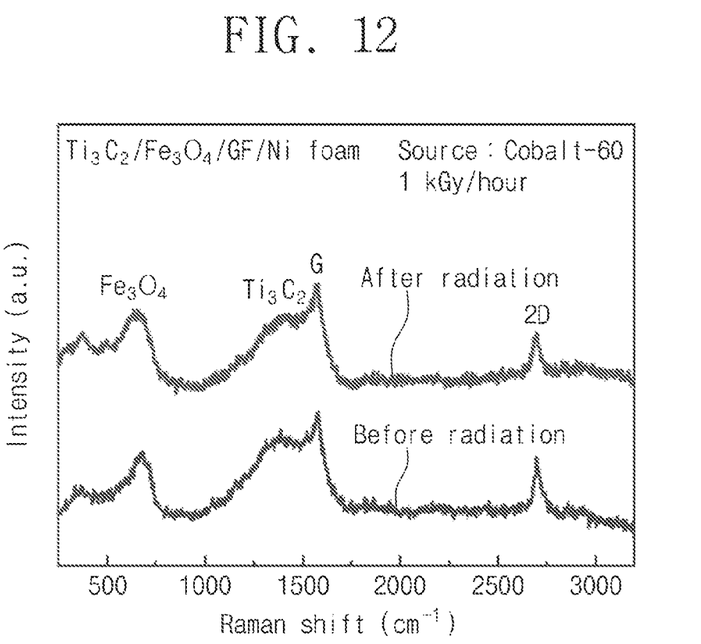
FIG. 12 is a graph showing a Raman analysis result of Comparative example according to irradiation.

FIG. 12 is a graph showing a Raman analysis result according to the irradiation in Experimental example 2. According to FIG. 12, the peaks of the first sensing material (graphene), the conductive structure ($Ti_3C_2$) of the second sensing material, and the nanoparticles ($Fe_3O_4$) of the second sensing material were measured, before and after irradiation. It can be observed that there was no change in Raman spectrum of the first sensing material and the second sensing material in Experimental example 2, before and after irradiation. In other words, it can be observed that there was no change in physical properties of the first sensing material and the second sensing material after irradiation in Experimental example 2. It was observed that there was no change in physical properties of the first sensing material and the second sensing material of the temperature-pressure complex sensor with an anti-radiation property according to the inventive concept after irradiation, and the first sensing material and the second sensing material have an anti-radiation property.

Referring to results in FIGS. 11 and 12, it can be confirmed that the temperature-pressure complex sensor with an anti-radiation property according to the inventive concept has an anti-radiation property.

The electrical properties of the resultant products of Experimental example 1 was measured, while the resultant products of Experimental example 1 was irradiated. Cobalt-60 as a radiation source was used for irradiation, and the radiation irradiation dose was approximately 1 kGy/hour. The total irradiation time of the radiation was 20 hours and 23 minutes, and the cumulative dose was 20.55 kGy. At this point, using Experimental example 1, the electrical properties of the resultant products of Experimental example 1 were compared between reference sample (Ref.) without irradiation and a first to sixth samples (S1, S2, S3, S4, S5, and S6) with irradiation. Changes in voltage applied to the reference sample (Ref.) and the first to sixth samples (S1, S2, S3, S4, S5, and S6) were measured according to the irradiation time of the radiation, while the resultant products of the first to sixth samples (S1, S2, S3, S4, S5, and S6) were irradiated.

Figure 13:
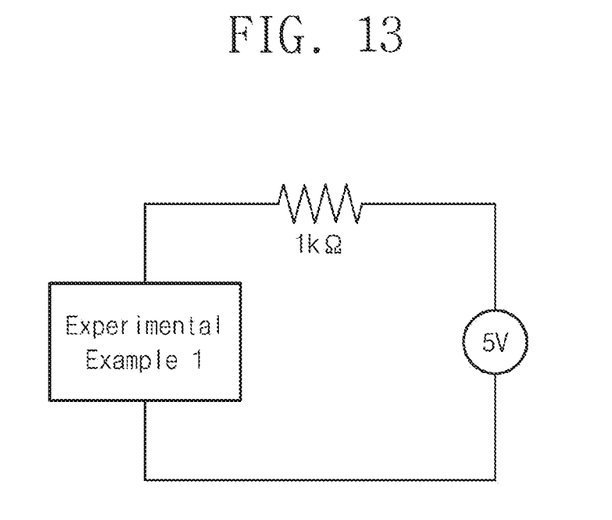
FIG. 13 is a circuit diagram of a circuit configured to measure a change in electrical property of Experimental example 1 according to irradiation.

FIG. 13 is a circuit diagram of a circuit configured to measure the electrical properties of the resultant products of Experimental example 1. As shown in FIG. 13, an experiment was performed to measure the voltage applied to Experimental example 1 after connecting 5 V power source and 1 kΩ resistor to Experimental example 1.

Figure 14:
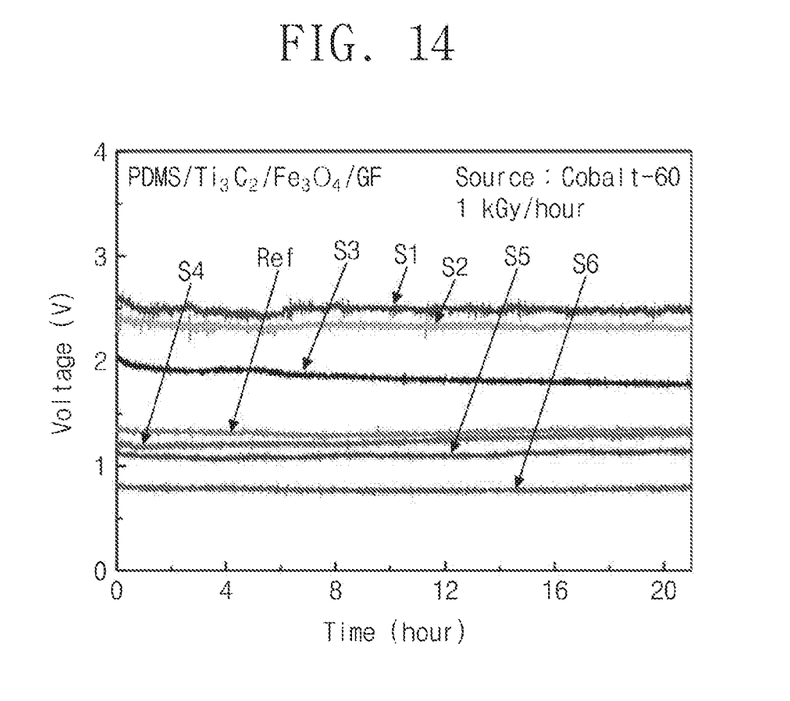
FIG. 14 is a graph showing measurements of a change in electrical property of Experimental example 1 according to irradiation.

FIG. 14 is a graph showing results of measuring the electrical properties of Experimental example 1. According to FIG. 14, it can be observed that, the voltage applied to the first to sixth sample (S1, S2, S3, S4, S5, and S6) was maintained as similar to an initial value, according to irradiation. In other words, it can be found that sensing property of a temperature-pressure complex sensor with an anti-radiation property according to the inventive concept was maintained despite the irradiation.

Change in resistance according to temperature and pressure was measured using Experimental example 1.

Figure 15:
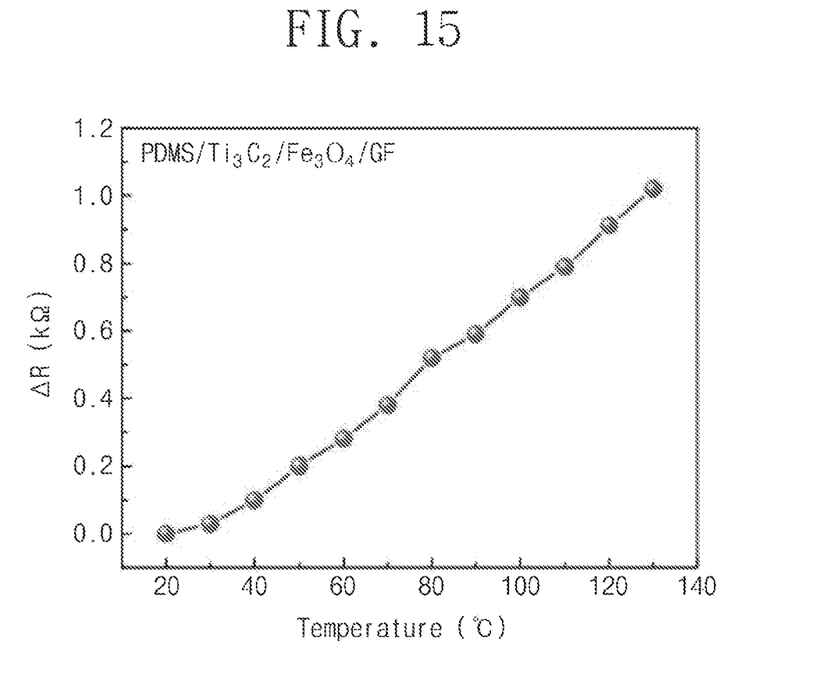
FIG. 15 is a graph showing a change in resistance of Experimental example 1 according to the temperature.

FIG. 15 is a graph showing change in resistance according to temperature of Experimental example 1. According to FIG. 15, it can be observed that the resistance change ($\Delta R$) increases to a positive value as temperature increases.

Figure 16:
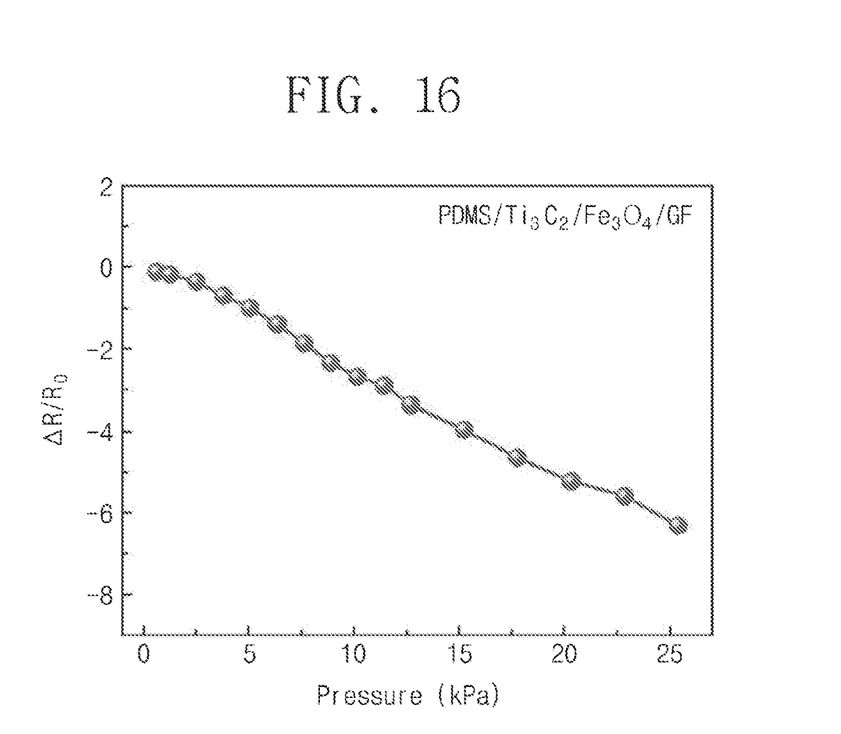
FIG. 16 is a graph showing an amount of change in resistance of Experimental example 1 according to the pressure.

FIG. 16 is a graph showing an amount of change in resistance according to pressure of Experimental example 1. According to FIG. 16, it can be observed that the rate ($\Delta R/R0$) of change in resistance increases to a negative value as external pressure increases.

In other words, the resistance of a temperature-pressure complex sensor with an anti-radiation property according to the inventive concept may proportionally change to the temperature changes, and the rate of change in resistance may vary according to pressure changes. Accordingly, the temperature-pressure complex sensor according to the inventive concept is capable of simultaneously measuring temperature and pressure, and an optional measure of temperature and pressure is also possible.

A temperature-pressure complex sensor with an anti-radiation property according to embodiments of the inventive concept may detect a change in temperature using a first sensing material, and may detect a change in external pressure and a compressive force using the first sensing material and a second sensing material. Furthermore, the second sensing material may include nanoparticles between crystal layers of a conductive structure in which a contact resistance varies with pressure, thereby improving a compressive force sensing sensitivity of the second sensing material.

In a temperature-pressure complex sensor with an anti-radiation property according to embodiments of the inventive concept, a porous first sensing material and a protective layer covering the same are flexible. Thus, a flexible temperature-pressure complex sensor having an anti-radiation property, and a flexible anti-radiation structure may be provided.

A temperature-pressure complex sensor with an anti-radiation property according to embodiments of the inventive concept may not be deteriorated in sensing property in extreme environments such as high-radiation environments.

An anti-radiation structure according to embodiments of the inventive concept may have flexibility, and include an anti-radiation material capable of shielding the radiation. Accordingly, the anti-radiation structure may easily shield a radiation regardless of the shape of a radiation source or the shape of an object to be protected.

As the above, the exemplary embodiments of the inventive concept have been described with reference to the accompanying drawings, it should be understood by one of ordinary skill in the art that the inventive concept may be implemented in another concrete form without changing the technical spirit or an essential feature thereof. Therefore, the aforementioned exemplary embodiments are to be considered all illustrative and not restrictive.

What is claimed is:

1. A temperature-pressure complex sensor with an anti-radiation property comprising:
   a first sensing material which is a porous conductive film; and
   second sensing materials dispersedly disposed on a surface of the first sensing material,
   wherein the second sensing materials include:
   a conductive structure having a two-dimensional crystal structure having crystal layers; and
   nanoparticles disposed between the crystal layers of the conductive structure.

2. The temperature-pressure complex sensor of claim 1, wherein the first sensing material comprises a conductive material having a two- dimensional crystal structure, the first sensing material having holes vertically passing through the surface of the first sensing material.

3. The temperature-pressure complex sensor of claim 2, wherein the first sensing material comprises a multilayer graphene.

4. The temperature-pressure complex sensor of claim 1, wherein the a porosity of the first sensing material is 50% to 98%.

5. The temperature-pressure complex sensor of claim 1, wherein the conductive structure and the nanoparticles comprise an anti-radiation material.

6. The temperature-pressure complex sensor of claim 1, wherein the conductive structure comprises transition metal carbides.

7. The temperature-pressure complex sensor of claim 1, wherein the nanoparticles comprise metal oxides having a gamma ray shielding property.

8. The temperature-pressure complex sensor of claim 1, further comprising a protective layer which covers the first sensing material and the second sensing materials.

\* \* \* \* \*